United States Patent
Eriksen et al.

(10) Patent No.: US 12,200,888 B2
(45) Date of Patent: Jan. 14, 2025

(54) CUSTOMIZATION OF PROCESS VARIABLE TRANSMITTER WITH HERMETICALLY SEALED ELECTRONICS

(71) Applicant: Rosemount Inc., Shakopee, MN (US)

(72) Inventors: Christopher Lee Eriksen, Saint Paul, MN (US); Nicholas Aaron Wienhold, Waconia, MN (US); Kurt Calvin Diede, Shakopee, MN (US)

(73) Assignee: Rosemount Inc., Shakopee, MN (US)

(*) Notice: Subject to any disclaimer, the term of this patent is extended or adjusted under 35 U.S.C. 154(b) by 191 days.

(21) Appl. No.: 18/157,362

(22) Filed: Jan. 20, 2023

(65) Prior Publication Data

US 2023/0247787 A1    Aug. 3, 2023

Related U.S. Application Data

(60) Provisional application No. 63/305,563, filed on Feb. 1, 2022.

(51) Int. Cl.
*H05K 5/06* (2006.01)
*H05K 5/02* (2006.01)
*H05K 9/00* (2006.01)

(52) U.S. Cl.
CPC ............ *H05K 5/06* (2013.01); *H05K 5/0247* (2013.01); *H05K 9/00* (2013.01)

(58) Field of Classification Search
CPC .......... H05K 5/06; H05K 5/0247; H05K 9/00; H05K 9/0066
See application file for complete search history.

(56) References Cited

U.S. PATENT DOCUMENTS

| | | | |
|---|---|---|---|
| 3,561,831 | A | 2/1971 | Alibert et al. |
| 4,208,698 | A | 6/1980 | Narasimhan |
| 4,424,404 | A | 1/1984 | Moore et al. |
| 4,620,438 | A | 11/1986 | Howng |

(Continued)

FOREIGN PATENT DOCUMENTS

| | | |
|---|---|---|
| CN | 101688814 | 3/2010 |
| CN | 207409457 | 5/2018 |

(Continued)

OTHER PUBLICATIONS

Notification of Transmittal of the International Search Report and the Written Opinion from the International Searching Authority for Application No. PCT/US2023/061161, dated May 9, 2023.

(Continued)

*Primary Examiner* — Sherman Ng
(74) *Attorney, Agent, or Firm* — Westman, Champlin & Koehler, P.A.

(57) ABSTRACT

A process variable transmitter includes a process variable sensor, and an electromagnetic interference (EMI) protection circuit coupled to the process variable sensor. The process variable transmitter also includes a hermetic module enclosing the EMI protection circuit, and electrical connectors coupled to the EMI protection circuit within the hermetic module. The electrical connectors are configurable from outside the hermetic module to connect electronic components of the EMI protection circuit in a configuration that provides transient protection.

17 Claims, 7 Drawing Sheets

(56) References Cited

U.S. PATENT DOCUMENTS

| | | | |
|---|---|---|---|
| 4,797,007 A | 1/1989 | Elmore, III | |
| 4,930,353 A | 6/1990 | Kato et al. | |
| 4,958,938 A | 9/1990 | Schwartz et al. | |
| 5,010,322 A * | 4/1991 | Fry | F23N 5/242 |
| | | | 361/818 |
| 5,181,417 A | 1/1993 | Nishida et al. | |
| 5,353,200 A | 10/1994 | Bodin et al. | |
| 5,524,333 A | 6/1996 | Hogue et al. | |
| 5,587,535 A | 12/1996 | Sasaki et al. | |
| 5,606,513 A | 2/1997 | Louwagie et al. | |
| 5,747,694 A | 5/1998 | Baba et al. | |
| 5,932,808 A | 8/1999 | Hayashi et al. | |
| 5,954,526 A * | 9/1999 | Smith | G01F 23/284 |
| | | | 439/709 |
| 6,105,437 A | 8/2000 | Klug et al. | |
| 6,176,137 B1 | 1/2001 | Sasaki et al. | |
| 6,487,898 B1 | 12/2002 | Haefner et al. | |
| 6,603,182 B1 | 8/2003 | Low et al. | |
| 6,722,205 B2 | 4/2004 | Bodin | |
| 6,938,491 B2 | 9/2005 | Clark et al. | |
| 7,000,478 B1 | 2/2006 | Zwollo et al. | |
| 7,190,053 B2 | 3/2007 | Orth et al. | |
| 7,441,461 B2 | 10/2008 | Muth et al. | |
| 7,538,401 B2 | 5/2009 | Eriksen et al. | |
| 7,726,269 B2 | 6/2010 | Ramond et al. | |
| 8,104,357 B2 | 1/2012 | Schlitzkus et al. | |
| 8,371,175 B2 | 2/2013 | Romo | |
| 9,459,170 B2 | 10/2016 | Haywood | |
| 9,638,600 B2 | 5/2017 | Haywood | |
| 9,709,272 B2 | 7/2017 | Scholzen et al. | |
| 9,964,459 B2 | 5/2018 | Brown et al. | |
| 10,018,033 B2 | 7/2018 | Leeflang et al. | |
| 10,132,156 B2 | 11/2018 | Leeflang et al. | |
| 10,209,154 B2 | 2/2019 | Strei et al. | |
| 10,330,538 B2 | 6/2019 | Rud et al. | |
| 10,459,024 B2 | 10/2019 | Wolff et al. | |
| 10,659,090 B2 | 5/2020 | Rodeheffer | |
| 10,794,736 B2 | 10/2020 | Andle et al. | |
| 10,914,635 B2 | 2/2021 | Schnaare | |
| 10,935,402 B2 | 3/2021 | Foss et al. | |
| 11,067,639 B2 | 7/2021 | Andle et al. | |
| 11,079,268 B2 | 8/2021 | Lovegren | |
| 11,153,985 B2 | 10/2021 | Andrew et al. | |
| 11,473,947 B2 | 10/2022 | Druzhkov et al. | |
| 11,480,488 B2 | 10/2022 | Roberts et al. | |
| 2005/0103111 A1 | 5/2005 | Imai et al. | |
| 2006/0128199 A1* | 6/2006 | Hedtke | G01D 11/24 |
| | | | 439/320 |
| 2006/0214909 A1 | 9/2006 | Poh et al. | |
| 2009/0140572 A1 | 6/2009 | Kim | |
| 2009/0320576 A1 | 12/2009 | Borgers et al. | |
| 2010/0048985 A1 | 2/2010 | Henke et al. | |
| 2010/0192696 A1 | 8/2010 | Schlitzkus et al. | |
| 2012/0067130 A1 | 3/2012 | Kaiser et al. | |
| 2012/0297886 A1 | 11/2012 | Lee et al. | |
| 2013/0080084 A1 | 3/2013 | Miller et al. | |
| 2013/0192379 A1 | 8/2013 | Petrarca | |
| 2014/0088905 A1* | 3/2014 | Rud | G01K 7/021 |
| | | | 702/133 |
| 2014/0331776 A1 | 11/2014 | Petrarca | |
| 2014/0352415 A1 | 12/2014 | Groenhuijzen et al. | |
| 2016/0033365 A1 | 2/2016 | Joly et al. | |
| 2017/0030790 A1 | 2/2017 | Buck et al. | |
| 2017/0089856 A1* | 3/2017 | McCoy | G01N 27/223 |
| 2017/0164901 A1 | 6/2017 | Shusterman | |
| 2020/0092950 A1 | 3/2020 | Schnaare et al. | |
| 2021/0148763 A1 | 5/2021 | Schnaare | |

FOREIGN PATENT DOCUMENTS

| | | |
|---|---|---|
| JP | 08-201203 | 8/1996 |
| JP | 11-44599 | 2/1999 |
| JP | 11-351990 | 12/1999 |
| JP | 2008-232931 | 10/2008 |
| WO | WO 2015/121486 | 8/2015 |

OTHER PUBLICATIONS

Anonymous, "Dynamic adaptive EMI filter technique", Research Disclosure, Kenneth Mason Publications, Hampshire, UK, GB, vol. 474, No. 74, Oct. 1, 2003 (Oct. 1, 2003), XP007132954.
Communication Pursuant to Rules 161(1) and 162 EPC from EP 23706511.5, dated Aug. 13, 2024.
Product Data Sheet, 00813-0100-4022, Rev PA, "Rosemount 4600 Oil and Gas Panel Pressure Transmitter, HART Revision 7", Jan. 2022, 20 pgs.
Communication Pursuant to Rules 161(1) and 162 EPC from European Patent Application No. 18721234.5, dated Feb. 7, 2020.
Office Action from Canadian Patent Application No. 3,068,397, dated Feb. 26, 2021.
Office Action from Japanese Patent Application No. 2019-572177, dated Feb. 24, 2021.
Notification of Transmittal of the International Search Report and the Written Opinion of the International Searching Authority from PCT/US2018/027226, dated Oct. 2, 2018.
Office Action from Chinese Patent Application No. 201711019670.8, dated Apr. 25, 2022.
Office Action from European Patent Application No. 18721234.5, dated Feb. 14, 2022.
Office Action from Japanese Application No. 2019-572177, dated Oct. 27, 2021.

* cited by examiner

CUSTOMIZATION OF PROCESS VARIABLE TRANSMITTER WITH HERMETICALLY SEALED ELECTRONICS

CROSS-REFERENCE TO RELATED APPLICATION

The present application is based on and claims the benefit of U.S. provisional patent application Ser. No. 63/305,563, filed Feb. 1, 2022, the content of which is hereby incorporated by reference in its entirety.

BACKGROUND

In the process control industry, process transmitters are often placed in or near corrosive/hazardous environments. Accordingly, in some process transmitter architectures, transmitter electronics are contained in a hermetically sealed package with flying lead wires as a customer interface to simplify approval requirements. To achieve a hermetic package, a limited number of electrical signals are passed through a sealed header interface.

Industrial process transmitters are typically offered with standard or transient protection options. The transient protection option provides increased protection to lightning and other unintended surges, but also requires additional transient-suppression electronic components that are to be protected from environmental conditions.

SUMMARY

Embodiments of the disclosure provide a process variable transmitter architecture in which signals from a sealed header can be configured to output connectors at final assembly to allow one common hermetic module to provide both standard and transient protection options. This overcomes some hazardous location approvals hurdles and provides the ability for late customization, which reduces module inventory.

In one embodiment, a process variable transmitter is provided. The process variable transmitter includes a process variable sensor, and an electromagnetic interference (EMI) protection circuit coupled to the process variable sensor. The process variable transmitter also includes a hermetic module enclosing the EMI protection circuit, and electrical connectors coupled to the EMI protection circuit within the hermetic module. The electrical connectors are configurable from outside the hermetic module to connect electronic components of the EMI protection circuit in a configuration that provides transient protection.

In another embodiment, a method is provided. The method includes enclosing an EMI protection circuit, coupled to a process variable sensor, in a hermetic module with electrical connectors extending outside the hermetic module. The method also includes, from outside the hermetic module, connecting, via the electrical connectors, electronic components of the EMI protection circuit in a configuration that provides transient protection.

In yet another embodiment, a process variable transmitter is provided. The process variable transmitter includes a process variable sensor, and an EMI protection circuit coupled to the process variable sensor. The process variable transmitter also includes a hermetic module enclosing the EMI protection circuit. The hermetic module has a first end comprising a feedthrough body and a plurality of feedthrough pins passing through the feedthrough body and hermetically sealed to the feedthrough body. The feedthrough pins are coupled to the EMI protection circuit within the hermetic module and are configurable from outside the hermetic module to connect electronic components of the EMI protection circuit in a configuration that provides transient protection.

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter. The claimed subject matter is not limited to implementations that solve any or all disadvantages noted in the Background.

DETAILED DESCRIPTION OF ILLUSTRATIVE EMBODIMENTS

Figure 1:
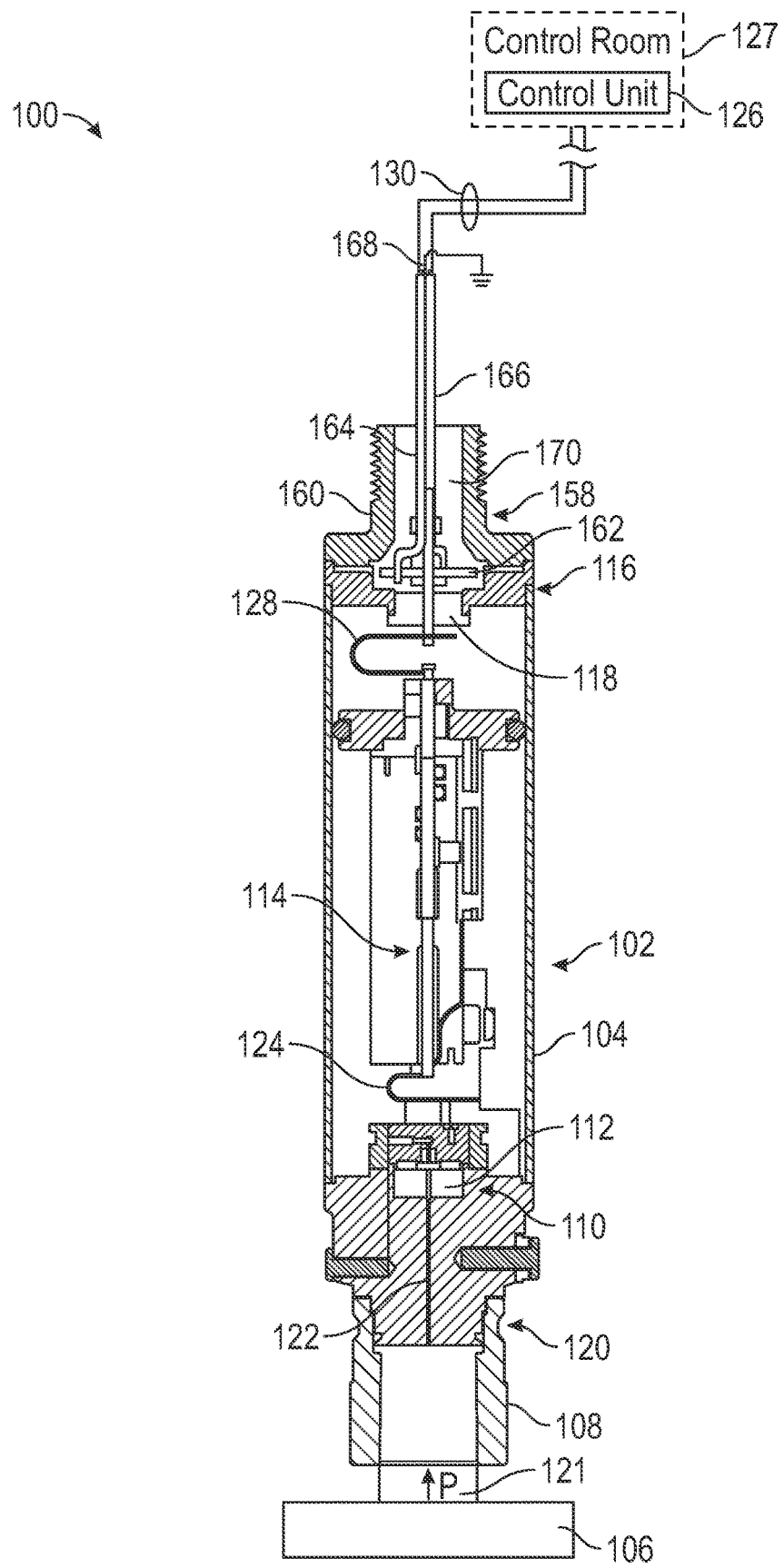
FIG. 1 is a partial cross-sectional view of an example of a process control system that includes a pressure transmitter in which embodiments of the present disclosure may be utilized.

Embodiments of the present disclosure are described more fully hereinafter with reference to the accompanying drawings. Elements that are identified using the same or similar reference characters refer to the same or similar elements. Some elements may not be shown in each of the figures in order to simplify the illustrations. The various embodiments of the present disclosure may be embodied in many different forms and should not be construed as limited to the specific embodiments set forth herein. Rather, these embodiments are provided so that this disclosure will be thorough and complete, and will fully convey the scope of the present disclosure to those skilled in the art.

Embodiments of the disclosure generally relate to customization of process variable transmitters with hermetically sealed electronics. More particularly, embodiments of the disclosure provide a common hermetic module that can be reconfigured after assembly to provide standard or transient protection options while meeting hazardous location approval requirements. Prior to providing details regarding the different embodiments, a description of an example process control system including a process transmitter is provided below.

FIG. 1 shows an example process control system in which certain specific embodiments disclosed herein may be incorporated. The process control system shown in FIG. 1 is for illustration purposes only. Embodiments of the present disclosure are not limited to any particular process control system such as the process control system shown in FIG. 1. Embodiments of the present disclosure are illustratively practiced within any number of different types of process control systems.

Figure 2:
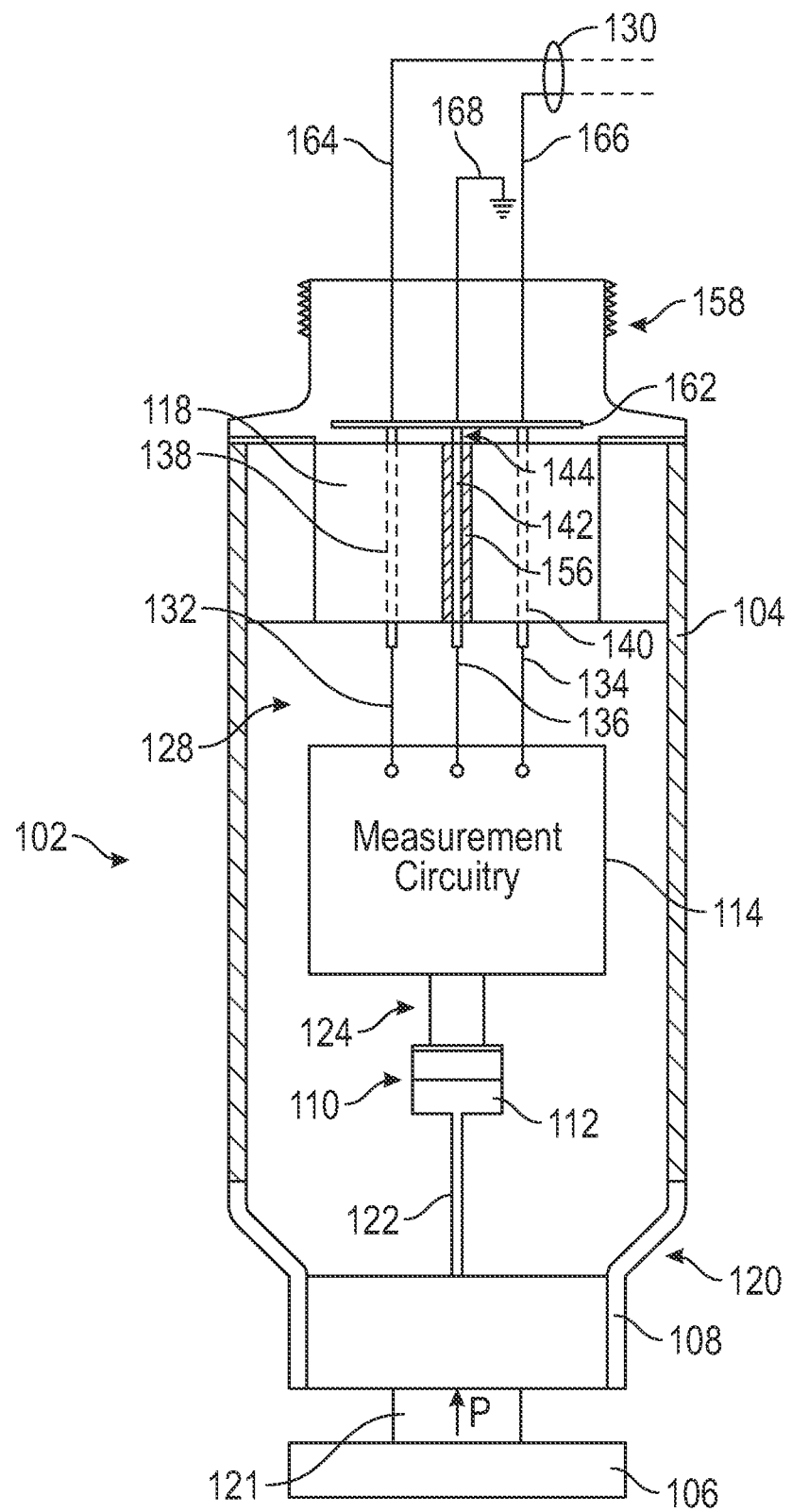
FIG. 2 is a simplified block diagram of the pressure transmitter of FIG. 1.

FIG. 1 is a schematic and partial cross-sectional view of an example of a process control system 100 that includes a process variable transmitter (e.g., a pressure transmitter) 102 in which embodiments of the present disclosure may be utilized. FIG. 2 is a simplified block diagram of the transmitter 102 of FIG. 1. The system 100 may be used in the processing of a material (e.g., process medium) to transform the material from a less valuable state into more valuable and useful products, such as petroleum, chemicals, paper, food, etc. For example, the system 100 may be used in facilities that perform hygienic or other types of industrial processes.

The pressure transmitter 102 may include a housing 104 that may be coupled to an industrial process 106 through a process coupling 108. The housing 104 and the process coupling 108 may be formed of stainless steel or another suitable material. The transmitter 102 includes a pressure sensor assembly 110, which includes a pressure sensor 112, and measurement circuitry 114 within housing 104. Measurement circuitry 114 may include processing/computation circuitry, communication circuitry and electromagnetic interference (EMI) protection circuitry. In transmitter 102, a first end 116 of housing 104 surrounds and contacts an exterior surface of a feedthrough body 118 for electrical connections described further below and is hermetically sealed to feedthrough body 118 through brazing or welding or any other suitable technique. Similarly, a second end 120 of housing 104 is hermetically sealed using any suitable technique to create a hermetically sealed chamber in which the pressure senor assembly 110 and the measurement circuitry 114 are housed.

The process coupling 108 may be connected to a pipe 121 that is connected to the process 106 and contains a process material (e.g., a fluid) at a pressure P that is to be measured by the pressure sensor 112. The pressure P is communicated to the pressure sensor 112 through a fluid pathway 122. The pressure sensor 112 includes a sensor element having an electrical parameter that is indicative of the applied pressure P. Measurement circuitry 114 may detect and process the electrical parameter of the sensor element through a suitable electrical connection 124 to establish a value for the sensed pressure P. The measured pressure value and any other information form measurement circuitry 114 is communicated to an external computerized control unit 126 in a remotely located control room 127 via a suitable output electrical connection 128 and through a process control loop 130, as indicated in FIG. 1.

As best seen in FIG. 2, the output electrical connection 128 has three electrical connectors (e.g., wires), which include a first active connector 132, a second active connector 134, and an electrical ground connector 136. A greater or lesser number of connectors may also be used. First ends of connectors 132, 134 and 136 are coupled to feedthrough pins 138, 140 and 142, respectively, which pass through the feedthrough body 118 and are sealed to feedthrough body 118 by a sealing material, such as glass or ceramic. For example, pin 142 passes through opening 144 in feedthrough body 118 and is sealed to feedthrough body 118 by glass cylindrical sealing layer 156. Second ends of wires 132, 134 and 136 may be connected to, for example, bond pads on a printed circuit board of transmitter measurement circuitry 114. Feedthrough body 118 together with feedthrough pins 138, 140 and 142 is sometimes referred to herein as a header.

As can be seen in FIGS. 1-2, transmitter 102 includes an output assembly 158 that is detachably couplable to housing 104. Output assembly 158 includes a housing 160, an output interface 162 and flying lead wires 164, 166 and 168 coupled to output interface 162. The output interface 162 and the portion of flying lead wires 164, 166 and 168 within housing 160 are encapsulated with any suitable material 170. When output assembly 158 is coupled to housing 104 as shown in FIG. 1, flying lead wires 164, 166 and 168 are electrically connected to connectors 132, 134 and 136, respectively, via output interface 162 and respective feedthrough pins 138, 140 and 142. Flying lead wire 168 is connected to electrical ground, and flying lead wires 164 and 166 are connected to process control loop 130.

Communication between the control unit 126, or another external computing device, and the pressure transmitter 102 may be performed over the control loop 130 in accordance with conventional analog and/or digital communication protocols. In some embodiments, the two-wire control loop 130 includes a 4-20 milliamp control loop, in which the measured pressure value may be represented by a level of a loop current flowing through the two-wire control loop 130. Exemplary digital communication protocols include the modulation of digital signals onto the analog current level of the two-wire control loop 130, such as in accordance with the HART® communication standard. Other purely digital techniques may also be employed including FieldBus and Profibus communication protocols.

In some embodiments, wireless communication between transmitter 102 and control unit 130 may also be provided. Exemplary wireless versions of the process control loop 130 include, for example, a wireless mesh network protocol, such as WirelessHART® (IEC 62591) or ISA 100.11a (IEC 62734), or another wireless communication protocol, such as WiFi, LoRa, Sigfox, BLE, or any other suitable protocol.

Power may be supplied to the pressure transmitter 102 from any suitable power source. For example, the pressure transmitter 102 may be wholly powered by the current flowing through the control loop 130. One or more power supplies may also be utilized to power the pressure transmitter 102, such as an internal or an external battery. An electrical power generator (e.g., solar panel, a wind power generator, etc.) may also be used to power the pressure transmitter, or charge a power supply used by the pressure transmitter 102.

It is desirable to manufacture hermetically sealed modules (e.g., housing 104 with internal components shown in FIGS. 1 and 2) for industrial process variable transmitters (e.g., pressure transmitter 102 of FIGS. 1 and 2) at a single site, and then allow late customization for standard or transient protection options at different final assembly locations. One technique for accomplishing this is to locate components that offer transient protection on a printed circuit assembly (PCA) outside of the hermetically sealed module. If this approach is utilized for process transmitter 102 of FIGS. 1 and 2, then output interface 162 would include the PCA. Here, the PCA would provide the connection between the hermetically sealed module 104 and the flying lead wires 164, 166 and 168 for the customer interface. The PCA and the flying wire 164, 166, 168 assemblies would be immersed in encapsulation material 170 to meet hazardous location approval requirements.

Figure 3:
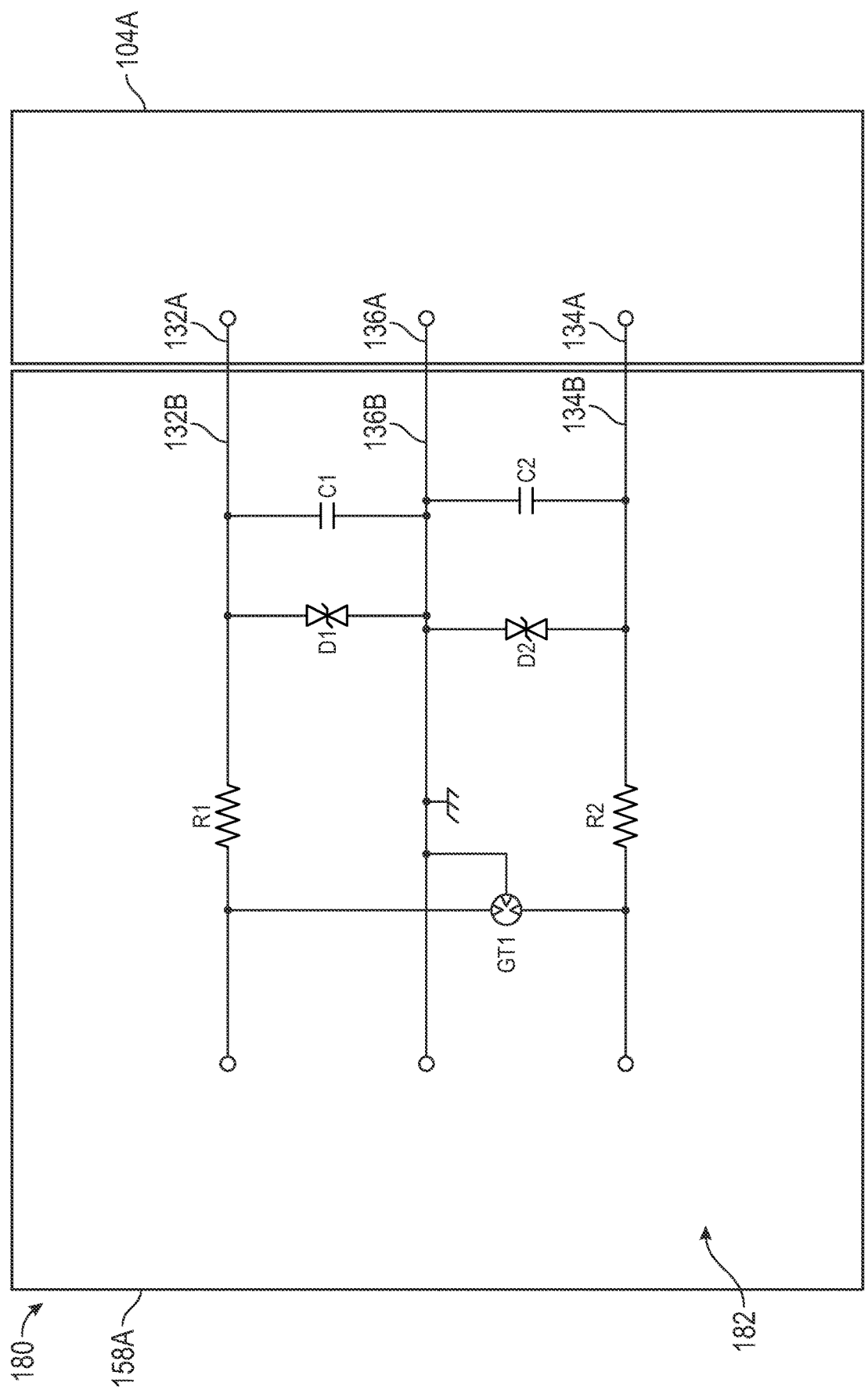
FIG. 3 is schematic diagram that illustrates an electrical architecture in which components for transient protection or electromagnetic interference (EMI) protection are outside a hermetic module of a process transmitter.

FIG. 3 is schematic diagram that illustrates an electrical architecture 180 in which components for transient protection are outside a hermetic module 104A of a process transmitter. Hermetic module 104A includes a first active electrical connector 132A, a second active electrical connector 134A, and an electrical ground connector 136A. Other circuitry and components (such as sensor assembly 110 of FIG. 1) within hermetic module 104A are not shown in the interest of simplification. An output assembly 158A that is detachably couplable to the hermetic module 104A includes an EMI protection circuit 182 that electrically connects to connectors 132A, 134A and 136A via electrical connectors 132B, 134B and 136B, respectively. EMI protection circuitry 182 includes capacitors C1 and C2, transient voltage suppression (TVS) diodes D1 and D2, a gas discharge tube GT1 and resistors R1 and R2. As can be seen in FIG. 3, first capacitor C1 is connected between active electrical connector 132B and electrical ground connector 136B, second capacitor C2 is connected between active electrical connector 134B and electrical ground connector 136B. Each capacitor C1, C2 has a capacitance value of 1500 picofarads (pF) or any other suitable capacitance value. Capacitors C1 and C2 slow any change in voltage or current in the circuit 182 due to an induced transient. TVS diodes D1 and D2 are in one embodiment bidirectional TVS diodes represented by two mutually opposing avalanche diodes in series with one another. First TVS diode D1 is connected between active electrical connector 132B and electrical ground connector 136B, and second TVS diode D2 is connected between active electrical connector 134B and electrical ground connector 136B. Each TVS diode D1, D2 may have a stand-off voltage or breakdown voltage of 70 volts (V) or any other suitable breakdown voltage value. TVS diodes D1 and D2 operate by shutting down excess current when the induced voltage exceeds the breakdown voltage. TVS diodes D1 and D2 automatically reset when the overvoltage goes away. Gas discharge tube GT1 is a three-electrode gas discharge tube with a first electrode 1 connected to active electrical connector 132B, a second electrode 2 connected to electrical ground connector 136B and a third electrode 3 connected to active electrical connector 134B. The three electrodes 1, 2 and 3 enable the use of single gas discharge tube GT1 for protecting the circuit 182. When a voltage appears across gas discharge tube GT1 that is greater than its rated breakdown voltage, the gas in gas discharge tube GT1 begins to ionize and conduct until it reaches its impulse sparkover voltage. At this point, gas discharge tube GT1 is in its fully on state and a low arc voltage is maintained irrespective of discharge current. When the transient passes, gas discharge tube GT1 resets to its non-conducting state. Gas discharge tube GT1 may have an impulse sparkover voltage of 90V or any other suitable impulse sparkover voltage value.

Resistors R1 and R2 are included in EMI protection circuit 182 to help provide protection from the time the transient is first induced to the time that the gas discharge tube GT1 reaches its impulse sparkover voltage. In the embodiment of FIG. 2, resistor R1 is connected in series with active electrical connector 132B, and resistor R2 is connected in series with active electrical connector 134B. Resistors R1 and R2 may be wire wound, axial, etc., and may have any suitable resistance values. As indicated above in connection with FIGS. 1 and 2, the PCA including EMI protection circuitry 182 and the flying wire 164, 166, 168 assemblies is immersed in encapsulation material 170 to meet hazardous location approval requirements.

It may also be desirable to leverage additional types of protection, such as Ex mb (encapsulation to provide a high safety level) or Ex eb (explosion protection according to the Increased Safety for Zone 1 standard) into the transmitter design. However, there are additional safety requirements that make it challenging to meet approvals. For example, components that may be considered an ignition risk, including capacitors (e.g., C1 and C2 of FIG. 3), gas discharge tubes (e.g., GT1 of FIG. 3), and resistors (e.g., R1 and R2 of FIG. 3), need to be immersed in a cemented joint that passed a high-pressure hydrostatic test before and after extended thermal aging.

In one instance, testing revealed that water penetrated the output assembly/header interface during high pressure testing and would not meet approval standards for additional types of protection such as Ex mb and Ex eb.

Figure 4:
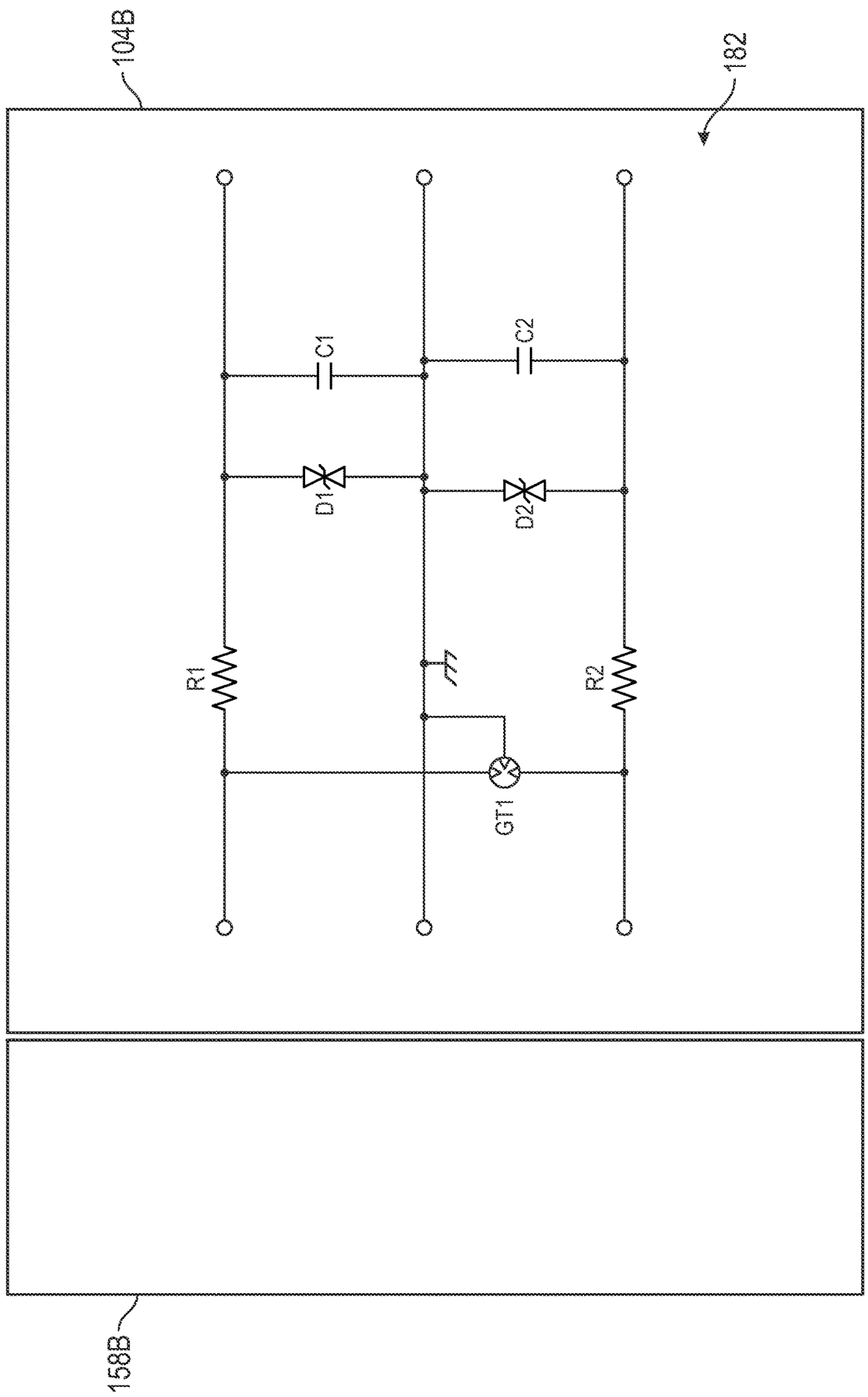
FIG. 4 shows a hermetically sealed module that includes EMI protection circuitry and an output assembly without any EMI protection components.

One technique for meeting the approval requirements for the additional types of protection involves moving all electrical components for transient protection (e.g., EMI protection circuitry 182) inside the hermetically sealed module. This simplifies the approval process for the output assembly 158 that only includes the flying wire 164, 166, 168 assembly immersed in encapsulation material 170, allowing a straightforward approach to receiving the approval requirements. However, the number of hermetically sealed modules is doubled because two versions of hermetically sealed modules—are used, with one version for standard protection and the other version for transient protection. FIG. 4 shows a hermetically sealed module 104B that includes EMI protection circuitry 182 and an output assembly 158B without any EMI protection components. The flying wire 164, 166, 168 assembly is not shown in FIG. 4 in the interest of simplification. A hermetically sealed module for the standard option is not shown.

In order to address the problems of complexity, cost, and early customization issues associated with having two different versions of the hermetically sealed modules, another solution is provided. That solution is described below in connection with FIGS. 5 and 6.

Figure 5:
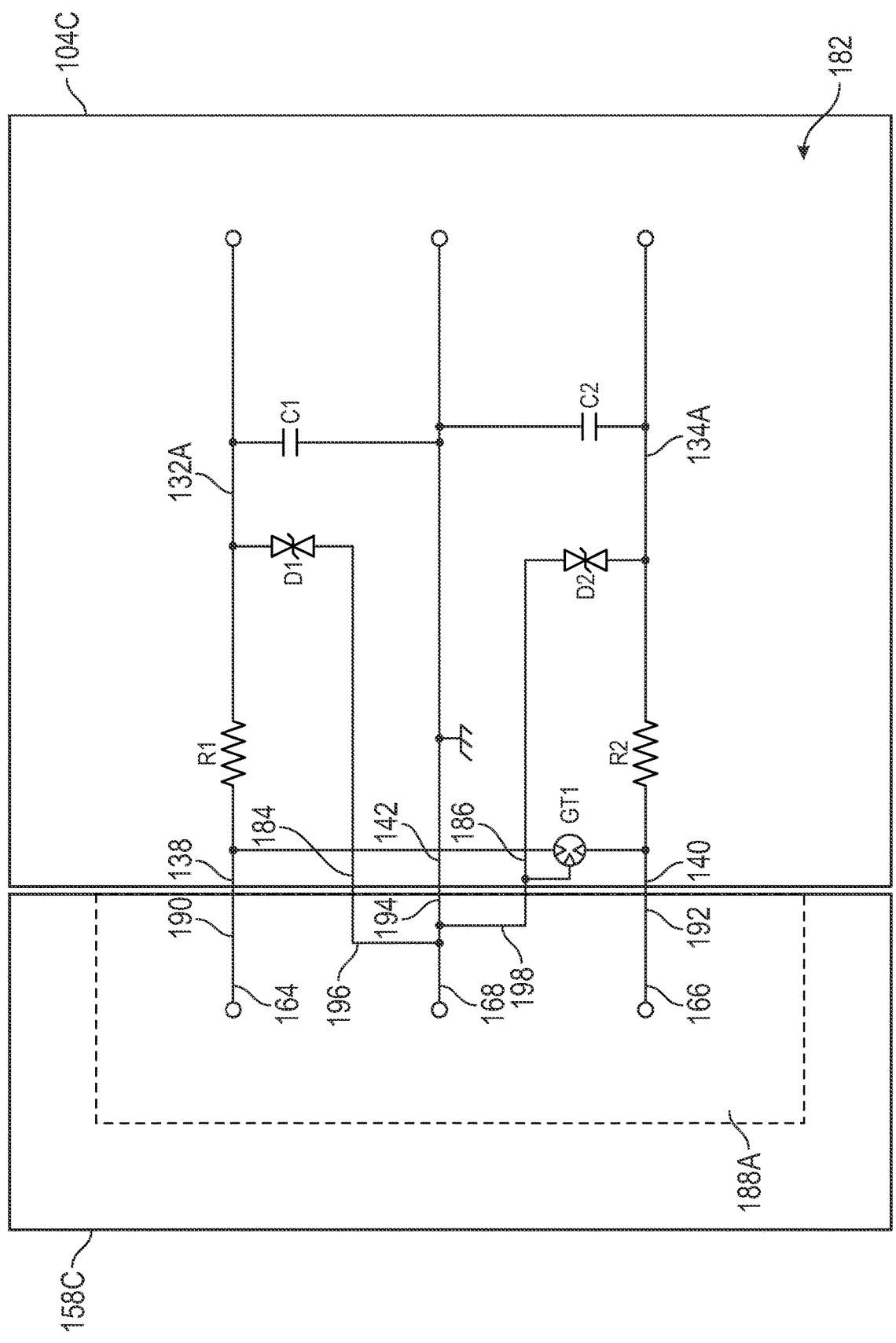
FIG. 5 is a schematic diagram that illustrates a hermetic module-output assembly configuration in which additional feedthroughs are routed to electrical ground to enable transient protection in accordance with one embodiment.
Figure 6:
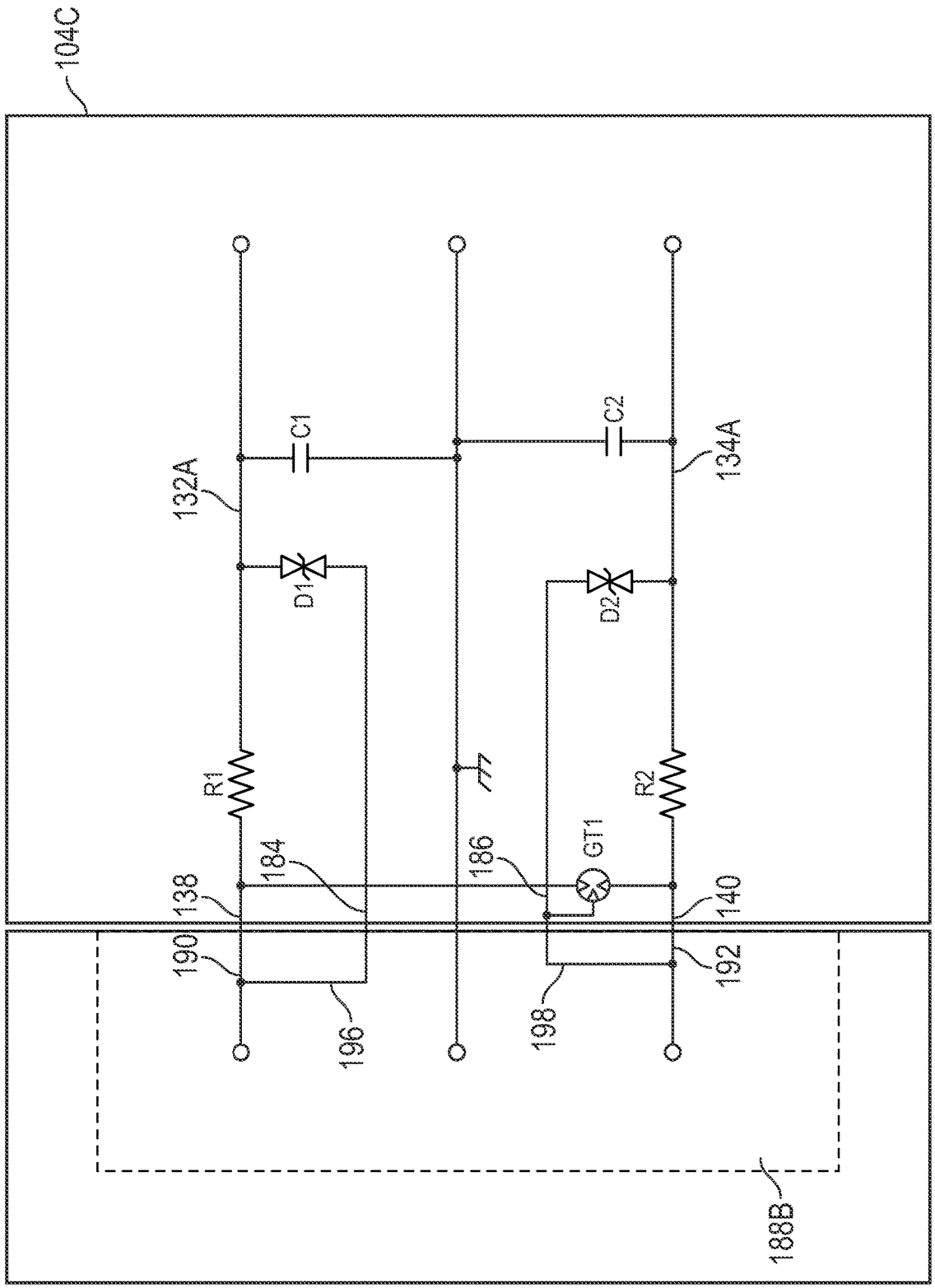
FIG. 6 is a schematic diagram that illustrates a hermetic module-output assembly configuration in which additional feedthroughs are routed back to their respective lines for units without transient protection.

Embodiments of the disclosure described herein in connection with FIGS. 5 and 6 provide an architecture in which the electronics inside a hermetically sealed package can be reconfigured after assembly while meeting hazardous location approval requirements. Late customizations of standard and transient outputs are selected at hubs during the final assembly process. The costs, complexities, and distribution challenges associated with the architecture described above in connection with FIG. 4 are avoided. Also, since no components are placed inside the encapsulated area of the output assembly, safety Zone 1 approvals are simplified.

As in the architecture of FIG. 4, the architecture shown in FIGS. 5 and 6 moves electronic components inside the hermetically sealed module. However, connections to the protection diodes D1 and D2 and gas discharge tube GT1 are passed outside the hermetic package using extra feedthroughs on an existing header. Late customization is achieved by attaching different wire interface boards during final assembly.

FIG. 5 is a schematic diagram that illustrates a first hermetic module 104C-output assembly 158C configuration in which additional feedthroughs 184 and 186 are routed to ground to enable transient protection in accordance with one embodiment. As can be seen in FIG. 5, hermetic module 104C includes EMI protection circuit 182 with transient protections elements to which additional feedthroughs 184 and 186 are connected. More specifically, feedthrough 184 is connected to first TVS diode D1 and feedthrough 186 is connected to both second TVS D2 and gas discharge tube GT1. Output assembly 158C includes a wire interface board 188A including connectors (e.g., traces) 190, 192, 194, 196 and 198. Trace 190 connects to active flying lead wire 164, trace 192 connects to active flying lead wire 166, and trace 194 connects to ground flying lead wire 168. Traces 196 and 198 are connected to ground trace 194. When output assembly 158C is coupled to hermetic module 104C, traces 190, 192, 194, 196 and 198 connect to feedthroughs 138, 140, 142, 184 and 186, respectively. As can be seen in FIG. 5, in this connection configuration, first TVS diode D1 is connected between active electrical connector 132A and electrical ground via trace 196, and second TVS diode D2 is connected between active electrical connector 134A and electrical ground via trace 198. Also, the second electrode 2 of gas discharge tube GT1 is connected to electrical ground via trace 198. Accordingly, transient protection is enabled in this connection configuration.

FIG. 6 is a schematic diagram that illustrates a second hermetic module 104C-output assembly 158C configuration in which additional feedthroughs 184 and 186 are routed back to their respective lines 132A and 134A for units without transient protection. In wire interface board 188B of FIG. 6, trace 196 is routed to trace 190, which electrically connects to active electrical connector 132A via feedthrough 138. Similarly, trace 198 is routed to trace 192, which electrically connects to active electrical connector 134A via feedthrough 140. Accordingly, no transient protection is provided in this configuration. Other than the routing for no transient protection, the remaining portion of the circuit of FIG. 6 is similar to the circuit of FIG. 5.

This architecture shown in FIGS. 5 and 6 allows the same hermetic module to be used for units with and without transient protection. Customization may occur at hubs, potentially weeks after it would have occurred with the architecture of FIG. 4, for example. The additional cost to establish additional modules and the greater annual cost to maintain them are avoided. It should be noted that, instead of employing different wire interface boards 188A and 188B for the two different connection configurations, a single wire interface board with one or more switches to switch between the two configurations may be employed.

The approval process is also streamlined. Since the concept of increased safety Zone 1 approval is to reduce the risk of thermal and spark hazards, the use of many common electrical components are not allowed. Removing the electrical components from the encapsulated conduit entry area allows for a seamless and straightforward analysis to be carried out to obtain the approval.

This approach allows flexibility for the end user to install the device either as Flameproof or Increased Safety. Since all electronic components are moved inside the hermetically sealed package, the electronics are insensitive to humidity. Very late customization is possible. A user could potentially configure the device during commissioning. Devices can be reconfigured long after the customer takes possession of them. For example, a customer could reconfigure devices in the field, potentially years after initial commissioning.

The architecture of the embodiments can be extended to include other functionality. For example:
 a. A unit could be configured to communicate using HART, Fieldbus, or Modbus protocols.
 b. A unit could be configured for standard or low power output protocols.

Figure 7:
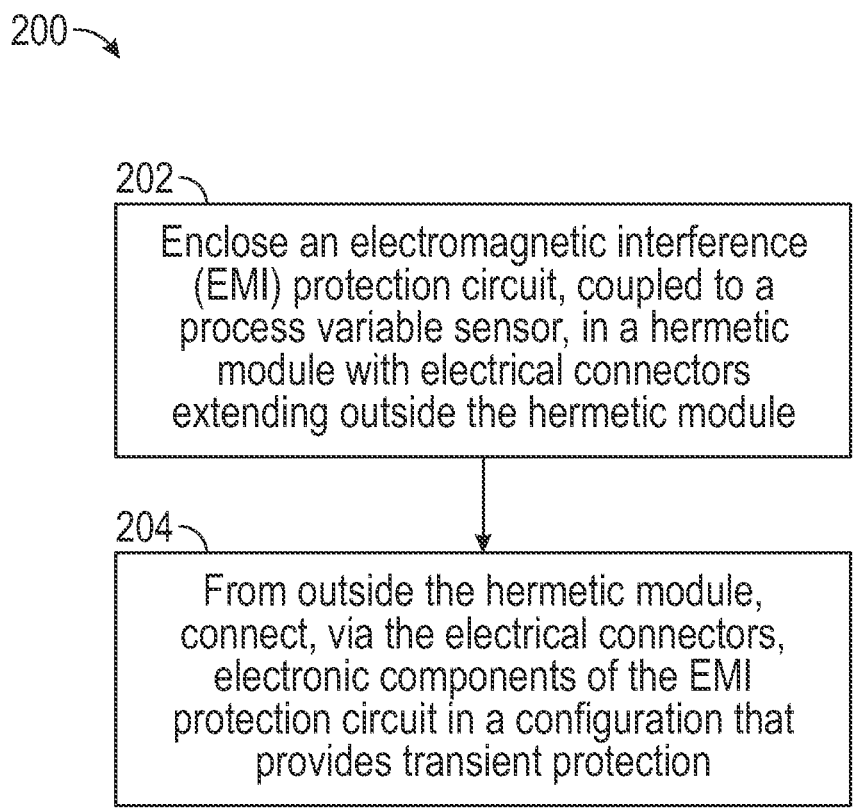
FIG. 7 is a simplified flow diagram of a method embodiment.

FIG. 7 is a simplified flow diagram of a method 200 embodiment. At 202, an electromagnetic interference (EMI) protection circuit, coupled to a process variable sensor, is enclosed in a hermetic module with electrical connectors extending outside the hermetic module. At 204, from outside the hermetic module, electronic components of the EMI protection circuit are connected, via the electrical connectors, in a configuration that provides transient protection.

Although the present invention has been described with reference to preferred embodiments, workers skilled in the art will recognize that changes may be made in form and detail without departing from the spirit and scope of the invention.

What is claimed is:

1. A process variable transmitter, comprising: a process variable sensor; an electromagnetic interference (EMI) protection circuit coupled to the process variable sensor; a hermetic module enclosing the EMI protection circuit; and electrical connectors coupled to the EMI protection circuit within the hermetic module and configurable from outside the hermetic module to connect electronic components of the EMI protection circuit in a configuration that provides transient protection; wherein the electrical connectors coupled to the EMI protection circuit within the hermetic module are configurable from outside the hermetic module to connect the electronic components of the EMI protection circuit in a standard configuration without the transient protection.

2. The process variable transmitter of claim 1 and wherein the electrical connectors comprise a first electrical connector electrically coupled to a first electronic component of the electrical components of the EMI protection circuit, and wherein the first electronic component is further coupled to an active electrical conductor.

3. The process variable transmitter of claim 2 and wherein the first electrical connector is couplable to an electrical ground connector outside the hermetic module to enable the first electronic component to provide the transient protection.

4. The process variable transmitter of claim 2 and wherein the first electrical connector is couplable to the active electrical conductor from outside the hermetic module to disable the first electronic component from providing the transient protection.

5. The process variable transmitter of claim 1 and further comprising a feedthrough body at a first end of the hermetic module, and the electrical connectors comprising a plurality of feedthrough pins passing through the feedthrough body and hermetically sealed to the feedthrough body, the feedthrough pins comprising:
 first and second active conductor feedthrough pins enabling electrical coupling of first and second active electrical conductors inside the hermetic module to first and second active electrical conductors outside the hermetic module; an electrical ground feedthrough pin enabling electrical coupling of an electrical ground connector inside the hermetic module to an electrical ground connector outside the hermetic module;
 and first and second additional feedthrough pins coupled to different ones of the electronic components of the EMI protection circuit, wherein each different one of the electronic components is further coupled to the first or second active electrical conductors in the hermetic module.

6. The process variable transmitter of claim 5 and wherein the first and second additional feedthrough pins are coupled to the electrical ground connector outside the hermetic module to enable the transient protection from outside the hermetic module.

7. The process variable transmitter of claim 5 and wherein, to disable the transient protection, the first additional feedthrough pin is coupled to the first active electrical conductor outside the hermetic module, and the second additional feedthrough pin is coupled to the second active electrical conductor outside the hermetic module.

8. The process variable transmitter of claim 5 and wherein the electronic components comprise first and second transient voltage suppression (TVS) diodes, and a gas discharge tube.

9. The process variable transmitter of claim 8 and wherein: the first TVS diode is coupled to the first active electrical conductor in the hermetic module and coupled to the first additional feedthrough pin in the hermetic module; the second TVS diode is coupled to the second active electrical conductor in the hermetic module and coupled to the second additional feedthrough pin in the hermetic module; and the gas discharge tube is coupled to the first and second active electrical conductors in the hermetic module and coupled to the second additional feedthrough pin in the hermetic module.

10. A method comprising: enclosing an electromagnetic interference (EMI) protection circuit, coupled to a process variable sensor, in a hermetic module with electrical connectors extending outside the hermetic module; from outside the hermetic module, connecting, via the electrical connectors, electronic components of the EMI protection circuit in a configuration that provides transient protection; and from outside the hermetic module, connecting, via the electrical connectors, the electronic components of the EMI protection circuit in a standard configuration without the transient protection.

11. The method of claim 10 and further comprising electrically coupling a first electrical connector of the electrical connectors to a first electronic component of the electrical components of the EMI protection circuit, wherein the first electronic component is further coupled to an active electrical conductor.

12. The method of claim 11 and further comprising coupling the first electrical connector to an electrical ground connector outside the hermetic module to provide the transient protection by the first electronic component.

13. The method of claim 11 and further comprising electrically coupling the first electrical connector to the active electrical conductor from outside the hermetic module to disable the first electronic component from providing the transient protection.

14. A process variable transmitter, comprising: a process variable sensor; an electromagnetic interference (EMI) protection circuit coupled to the process variable sensor; a hermetic module enclosing the EMI protection circuit, the hermetic module having a first end comprising a feedthrough body and a plurality of feedthrough pins passing through the feedthrough body and hermetically sealed to the feedthrough body, wherein the feedthrough pins are coupled to the EMI protection circuit within the hermetic module and are configurable from outside the hermetic module to connect electronic components of the EMI protection circuit in a configuration that provides transient protection, wherein the plurality of feedthrough pins comprises: first and second active conductor feedthrough pins enabling electrical coupling of first and second active electrical conductors inside the hermetic module to first and second active electrical conductors outside the hermetic module; an electrical ground feedthrough pin enabling electrical coupling of an electrical ground connector inside the hermetic module to an electrical ground connector outside the hermetic module; and first and second additional feedthrough pins coupled to different one ones of the circuit electronic components of the EMI protection circuit, wherein each different one of the electronic components is further coupled to the first or second active electrical conductors in the hermetic module.

15. The process variable transmitter of claim 14 and wherein the first and second additional feedthrough pins are coupled to the electrical ground connector outside the hermetic module to enable the transient protection from outside the hermetic module.

16. The process variable transmitter of claim 14 and wherein, to disable the transient protection, the first additional feedthrough pin is coupled to the first active electrical conductor outside the hermetic module, and the second additional feedthrough pin is coupled to the second active electrical conductor outside the hermetic module.

17. The process variable transmitter of claim 14 and wherein the electronic components comprise first and second transient voltage suppression (TVS) diodes, and a gas discharge tube, and wherein: the first TVS diode is coupled to the first active electrical conductor in the hermetic module and coupled to the first additional feedthrough pin in the hermetic module; the second TVS diode is coupled to the second active electrical conductor in the hermetic module and coupled to the second additional feedthrough pin in the hermetic module; the gas discharge tube is coupled to the first and second active electrical conductors in the hermetic module and coupled to the second additional feedthrough pin in the hermetic module.

\* \* \* \* \*